United States Patent
Liu et al.

(10) Patent No.: US 7,167,398 B1
(45) Date of Patent: Jan. 23, 2007

(54) SYSTEM AND METHOD FOR ERASING A MEMORY CELL

(75) Inventors: Zhizheng Liu, San Jose, CA (US); Satoshi Torii, Sunnyvale, CA (US); Mark Randolph, San Jose, CA (US); Yi He, Fremont, CA (US)

(73) Assignee: Spansion L.L.C., Sunnyvale, CA (US)

( * ) Notice: Subject to any disclaimer, the term of this patent is extended or adjusted under 35 U.S.C. 154(b) by 74 days.

(21) Appl. No.: 11/062,641

(22) Filed: Feb. 23, 2005

(51) Int. Cl.
*G11C 11/34* (2006.01)
*G11C 16/04* (2006.01)

(52) U.S. Cl. .......................... 365/185.29; 365/185.27; 365/185.03

(58) Field of Classification Search ........... 365/185.29, 365/185.27, 185.03
See application file for complete search history.

(56) References Cited

U.S. PATENT DOCUMENTS

| | | | |
|---|---|---|---|
| 6,331,951 B1 * | 12/2001 | Bautista et al. ........ | 365/185.22 |
| 6,834,012 B1 * | 12/2004 | He et al. ................ | 365/185.18 |
| 6,901,010 B1 * | 5/2005 | Hamilton et al. ...... | 365/185.22 |
| 2005/0184337 A1 * | 8/2005 | Forbes ................... | 257/330 |
| 2005/0286312 A1 * | 12/2005 | Wu et al. .............. | 365/185.29 |
| 2006/0050553 A1 * | 3/2006 | Yeh ....................... | 365/185.01 |

OTHER PUBLICATIONS

2002 IEEE International Solid-State Circuits Conference, Session 6, "SRAM and Non-Volatile Memories," Feb. 4, 2004, 6 pages.
2002 IEEE International Solid-State Circuits Conference, 29 pages.
Suk-Kang Sung et al., "Fabrication and Program/Erase Characteristics of 30-nm SONOS Nonvolatile Memory Devices," *IEEE Transactions on Nanotechnology*, vol. 2, No. 4, Dec. 2003, pp. 258-264.

* cited by examiner

*Primary Examiner*—Anh Phung
*Assistant Examiner*—Toan Le
(74) *Attorney, Agent, or Firm*—Harrity Snyder, L.L.P.

(57) ABSTRACT

A method erases a memory cell of a semiconductor device that includes a group of memory cells. Each memory cell includes a group of storage regions. The method includes determining that each storage region of the group of storage regions of a first memory cell is to be erased and erasing the group of storage regions of the first memory cell via a single hot hole injection process.

17 Claims, 6 Drawing Sheets

SYSTEM AND METHOD FOR ERASING A MEMORY CELL

FIELD OF THE INVENTION

Implementations consistent with the principles of the invention relate generally to semiconductor devices and methods of manufacturing semiconductor devices. The invention has particular applicability to non-volatile memory devices.

BACKGROUND OF THE INVENTION

The escalating demands for high density and performance associated with non-volatile memory devices require small design features, high reliability and increased manufacturing throughput. The reduction of design features, however, challenges the limitations of conventional methodology.

One type of conventional electrically erasable programmable read only memory (EEPROM) device includes a silicon substrate with an oxide-nitride-oxide (ONO) stack formed on the substrate. A silicon control gate is formed over the ONO stack. This type of memory device is often referred to as a SONOS (silicon-oxide-nitride-oxide-silicon) type memory device. In a SONOS device, the nitride layer acts as the charge storage layer.

One type of SONOS device allows for two separate bits to be stored on opposite sides of a single memory cell. Reading, programming, and erasing of one side of the memory cell occurs independently of the data that is stored on the opposite side of the cell.

SUMMARY OF THE INVENTION

In an implementation consistent with the principles of the invention, a method for erasing a memory cell of a semiconductor device that includes a group of memory cells is provided. Each memory cell includes a group of storage regions. The method includes determining that each storage region of the group of storage regions of a first memory cell is to be erased and erasing the group of storage regions of the first memory cell via a single hot hole injection process.

In another implementation consistent with the principles of the invention, a method for erasing a memory cell of a semiconductor device is provided. The memory cell includes a gate region, a source region, and a drain region and includes a group of storage regions. The method includes applying a gate to substrate bias to the memory cell, applying a source to substrate bias to the memory cell, and applying a drain to substrate bias to the memory cell. The gate to substrate bias, the source to substrate bias, and the drain to substrate bias causes all of the plurality of storage regions of the memory cell to be erased.

In yet another implementation consistent with the principles of the invention, a memory cell includes a substrate, a first dielectric layer formed over the substrate, a charge storage element configured to store two bits of data, an intergate dielectric formed over the charge storage element, a control gate formed over the intergate dielectric, a source region, and a drain region. The distance from the source region to the drain region ranges from about 100 Å to about 10,000 Å.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Exemplary Processing

Figure 1:
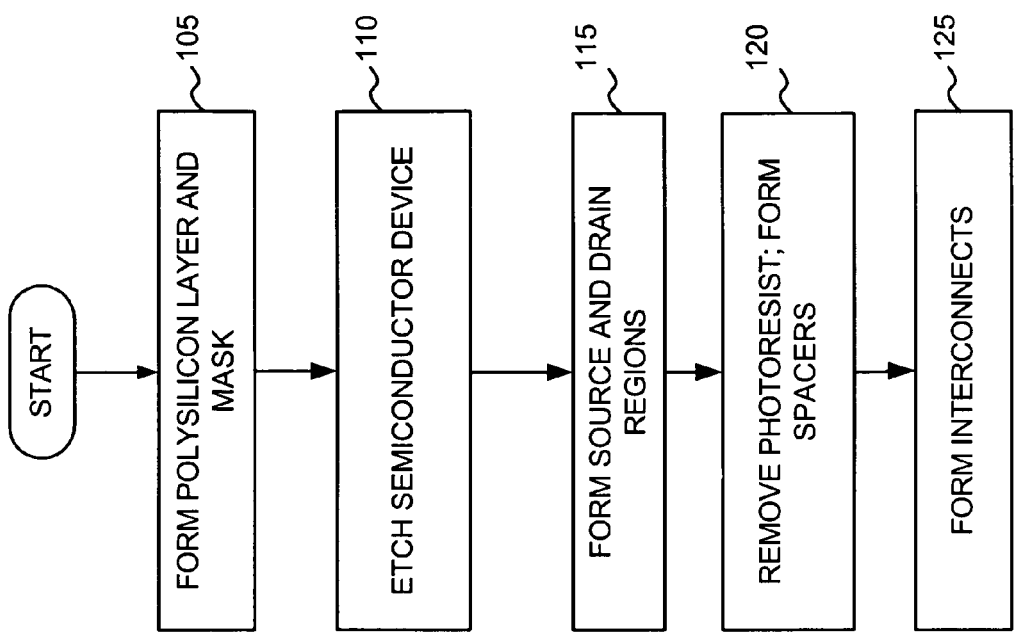
FIG. 1 illustrates an exemplary process for forming a semiconductor memory device in an implementation consistent with the principles of the invention.

FIG. 1 illustrates an exemplary process for forming a semiconductor memory device in an implementation consistent with the principles of the invention. In one implementation, the semiconductor memory device includes a core memory array of a flash memory device. FIGS. 2–5 illustrate exemplary views of a semiconductor memory device fabricated according to the processing described in FIG. 1.

Figure 2:
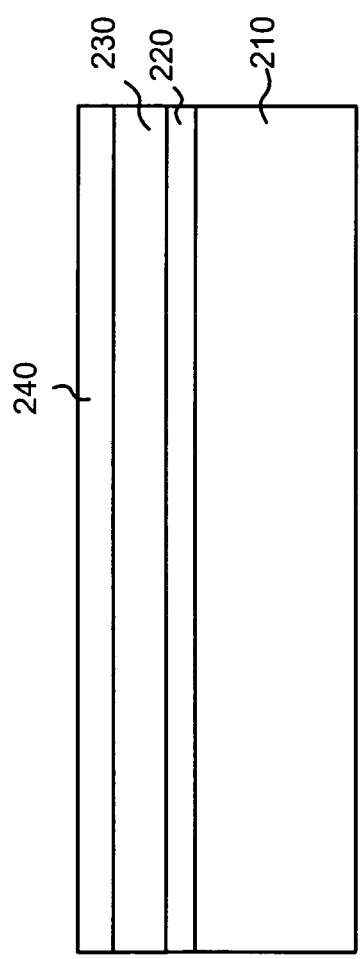
FIGS. 2–5 illustrate exemplary views of a semiconductor memory device fabricated according to the processing described in FIG. 1.

With reference to FIGS. 1 and 2, processing may begin with a semiconductor device 200 that includes layers 210, 220, 230 and 240. In an exemplary embodiment, layer 210 may include a substrate of semiconductor device 200 and may include silicon, germanium, silicon-germanium or other semiconducting materials. In alternative implementations, layer 210 may be a conductive layer or a dielectric layer formed a number of layers above the surface of a substrate in semiconductor device 100.

Layer 220 may be a dielectric layer formed on layer 210 in a conventional manner. In an exemplary implementation, dielectric layer 220 may include an oxide, such as a silicon oxide (e.g., $SiO_2$), and may have a thickness ranging from about 20 Å to about 100 Å. Dielectric layer 220 may function as a tunnel oxide layer for a subsequently formed memory cell of semiconductor device 200.

Layer 230 may be formed on layer 220 in a conventional manner and may include a dielectric material, such as a nitride (e.g., a silicon nitride), an oxide, such as $Al_2O_3$ or $HfO_2$, etc. Layer 230, consistent with the invention, may act as a charge storage layer for semiconductor device 200 and may have a thickness ranging from about 50 Å to about 1,000 Å.

Layer 240 may be formed on layer 230 in a conventional manner and may include a dielectric material, such as an oxide (e.g., $SiO_2$). Alternatively, layer 240 may include another dielectric material, such as a silicon oxynitride, that may be deposited or thermally grown on layer 230. In still other alternatives, layer 240 may be a composite that includes a number of dielectric layers or films. Layer 240 may have a thickness ranging from about 50 Å to about 500 Å and may function as an inter-gate dielectric for memory cells in semiconductor device 200.

Figure 3:
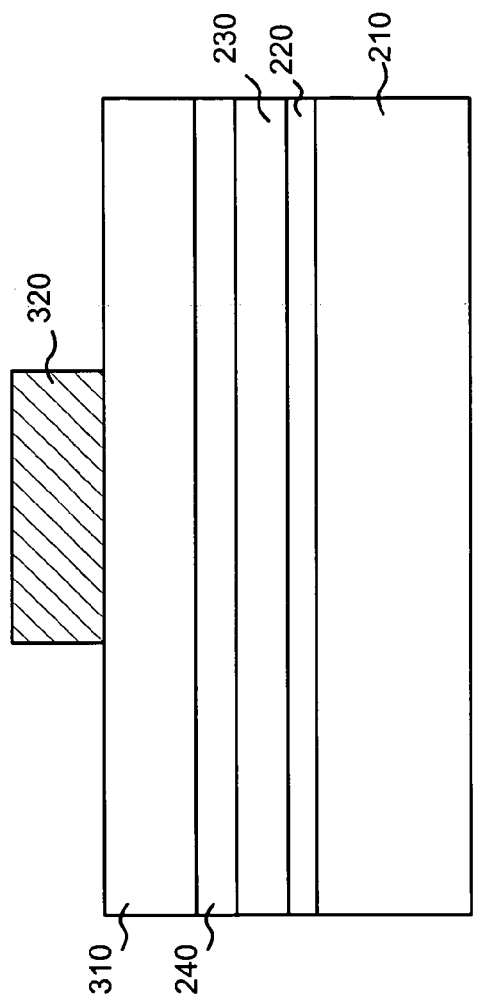

A conductive layer 310, such as polycrystalline silicon, may be formed on dielectric layer 240, as illustrated in FIG. 3 (act 105). Alternatively, conductive layer 310 may include other semiconducting materials, such as germanium or silicon-germanium, or various metals, such as titanium or tungsten. In an exemplary implementation, conductive layer 310 may have a thickness ranging from about 50 Å to about 5,000 Å. Conductive layer 310, consistent with the invention, may be used to form one or more control gate electrodes for one or more memory cells in semiconductor device 200. An optional silicide layer, such as titanium silicide (not shown) may be formed on conductive layer 310.

A photoresist material may be patterned and etched to form mask 320 on the top surface of conductive layer 310 (act 105). Mask 320 may be used to facilitate formation of one or memory cells in semiconductor device 200, as described in more detail below. The length of mask 320 may be selected such that the channel length of the resulting memory cells has a particular length that allows the memory cells to be erased in an efficient manner, as described in detail below.

Figure 4:
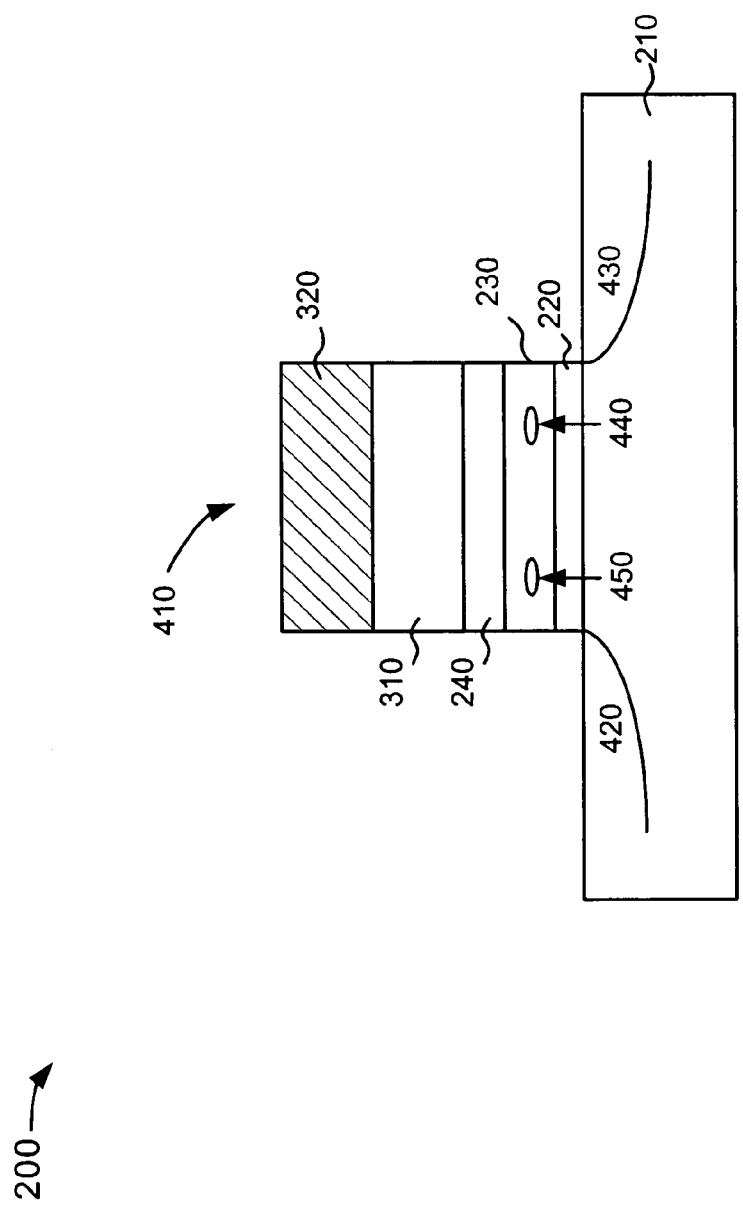

Semiconductor device 200 may then be etched, as illustrated in FIG. 4 (act 110). Referring to FIG. 4, layers 220–240 and 310 may be etched in a conventional manner with the etching terminating at substrate 210, thereby forming structure 410. Structure 410 (also referred to herein as "memory cell 410") may represent a memory cell of semiconductor device 200, where memory cell 410 includes a dielectric layer 220, a charge storage layer 230, an inter-gate dielectric layer 240, and a control gate electrode 310. Only one memory cell 410 is illustrated in FIG. 4 for simplicity. It should be understood that semiconductor device 200 may typically include a memory array including a large number of memory cells 410.

Source and drain regions 420 and 430 may be formed in substrate 210, as illustrated in FIG. 4 (act 115). For example, n-type or p-type impurities may be implanted in substrate 210 to form source and drain regions 420 and 430, based on the particular end device requirements. In one implementation, an n-type dopant, such as phosphorous or arsenic, may be implanted at a dosage ranging from about $1 \times 10^{14}$ atoms/$cm^2$ to about $1 \times 10^{17}$ atoms/$cm^2$ and an implantation energy ranging from about 1 KeV to about 100 KeV. Alternatively, a p-type dopant, such as boron, may be implanted at similar dosages and implantation energies. The particular implantation dosages and energy used to form source and drain regions 420 and 430 may be selected based on the particular end device requirements. One of ordinary skill in the art would be able to optimize the source/drain implantation process based on the particular circuit requirements. It should also be understood that source region 420 and drain region 430 may alternatively be formed at other points in the fabrication process of semiconductor device 200. For example, sidewall spacers may be formed prior to the source/drain ion implantation to control the location of the source/drain junctions based on the particular circuit requirements.

As illustrated in FIG. 4, charge storage layer 230 of memory cell 410 may include multiple charge storage regions. Two charge storage regions 440 and 450 are illustrated in FIG. 4 for explanatory purposes. A first charge storage region (also called a "first bit") 440 may be formed in the side of charge storage layer 230 near drain region 430 (e.g., the right side illustrated in FIG. 4) and a second charge storage region (also called a "second bit") 450 may be formed in the side of charge storage layer 230 near source region 420 (e.g., the left side illustrated in FIG. 4). As will be described in greater detail below, implementations consistent with the principles of the invention use a single band-to-band (BTB) induced hot hole injection operation to erase both bits 440 and 450 of memory cell 410. For example, each memory cell 410 consistent with the invention may be formed with a short channel length (e.g., the distance between source 420 and drain 430) such that BTB induced hot holes can reach the whole channel or almost the whole channel. In one implementation, the channel length (also approximately equal to the length of charge storage 230) may range from about 100 Å to about 10,000 Å. It should be understood that the channel length may vary based on the particular circuit requirements and junction parameters, such as the depths and concentrations for source region 420 and drain region 430, the thickness of dielectric layer 220, etc. In each case, the channel length of memory cell 410 may be short enough such that BTB hot holes can reach essentially the entire channel. Fabricating memory cells 410 with this short channel length enables the threshold voltage (Vt) associated with erasing memory cell 410 to be reduced. For example, unlike conventional techniques, a BTB induced hot hole injection performed on one side of memory cell 410 can be used to bring down the threshold voltage of memory cell 410 so as to erase either one bit or both bits of memory cell 410. In this way, the total erase time can be reduced.

Figure 5:
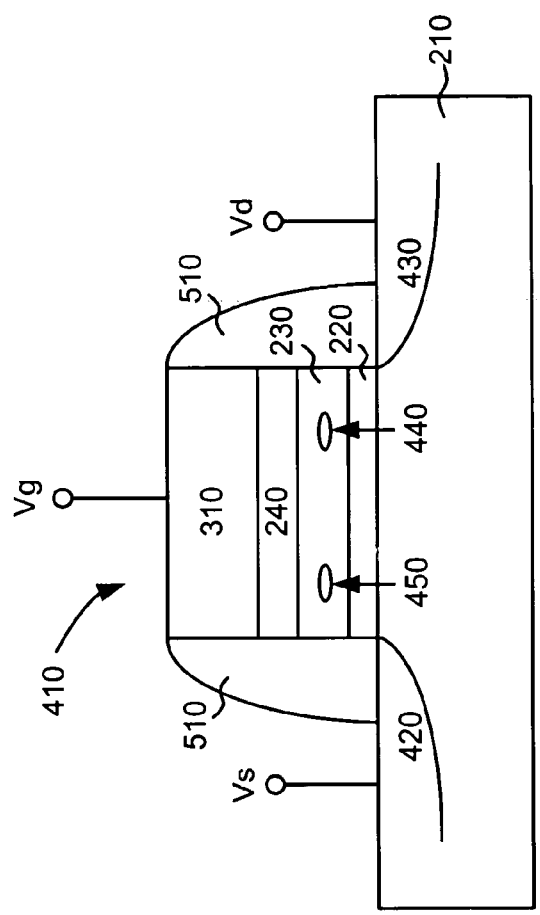

Photoresist mask 320 may then be removed using a conventional process (act 120). Spacers 510 may then be formed adjacent the sidewalls of memory cell 410, as illustrated in FIG. 5 (act 120). For example, a dielectric material, such as a silicon oxide, a silicon oxynitride or another dielectric material, may be deposited and etched to form spacers 510 on each side of memory cell 410, as illustrated in FIG. 5. Spacers 510 may be used to electrically isolate memory cell 410 from adjacent memory cells (not shown). Spacers 510 may also be used to facilitate the deposition of impurities in semiconductor device 200.

Fabrication processing may then continue with the formation of various interconnects based on the particular circuit requirements (act 125). For example, a dielectric layer (not shown) may be deposited over semiconductor device 200. The dielectric layer (also referred to an inter-layer dielectric (ILD)) may have a thickness ranging from about 1,000 Å to about 10,000 Å and may act as an ILD for semiconductor device 200. The ILD may include, for example, a phosphosilicate glass (PSG) material, a borophosphosilicate (BSPG) material, an oxide or some other dielectric material.

The ILD may optionally be planarized using a conventional process, such as a chemical-mechanical polishing (CMP) process. The CMP process may planarize the top surface of the ILD to facilitate formation of subsequent structures, such as interconnect lines. The ILD functions to isolate various conductive structures, such as various interconnect lines (not shown), source region 420, or drain region 430 from an external electrode, etc.

For example, a trench (not shown) may subsequently be formed in the ILD using conventional photolithographic and etching techniques. The trench may be used to form a contact to, for example, source region 420 or drain region 430. Next, a metal layer, such as copper or aluminum, may be deposited to fill the trench.

An interconnect line may be formed over the planarized top surface of the ILD. For example, a metal, such as copper or aluminum, may be deposited to form an interconnect that connects various features in semiconductor device 200, such as source or drain regions 420/430 to an external electrode, to facilitate programming or erasing various memory cells 410 in semiconductor device 200.

Figure 6:
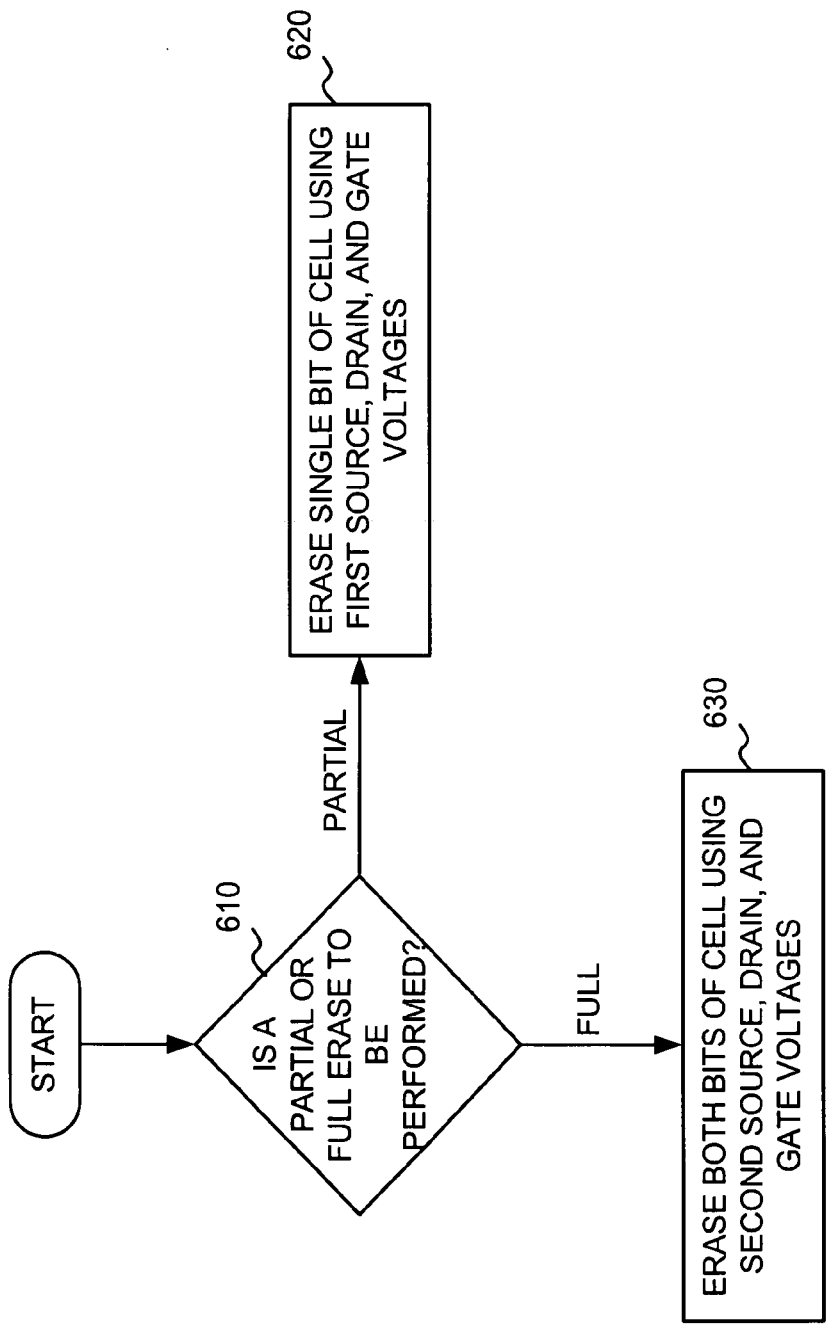
FIG. 6 illustrates an exemplary process for erasing a memory cell of a semiconductor memory device in an implementation consistent with the principles of the invention.

FIG. 6 illustrates an exemplary process for erasing a memory cell, such as memory cell 410, of a semiconductor device in an implementation consistent with the principles of the invention. Processing may begin by determining whether a partial erase or a full erase should be performed (act 610). A partial erase involves erasing a single charge storage region (or bit) (i.e., bit 440 or bit 450) of memory cell 410. A full erase involves erasing both bits 440 and 450 of memory cell 410. Unlike conventional erase techniques where two separate erase operations are used to erase both bits of a memory cell, implementations consistent with the principles of the invention allow for both bits of a memory cell to be erased via a single erase operation, thereby reducing the overall erase time of the memory cell.

If a partial memory erase is to be performed (act 610), a single bit (e.g., bit 440 or 450) of memory cell 410 may be erased using first source, drain, and gate biases (act 620). For example, in one implementation, erasing a single bit of memory cell 410 may be performed by applying a gate to substrate bias of about −4 volts to about −8 volts, a source to substrate bias of about −1 volts to about 2 volts, and a drain to substrate voltage of about 4 volts to about 5 volts. During erasing, electrons may tunnel from a single storage region 440 or 450 into substrate 210 (e.g., source or drain regions 420/430) via dielectric layer 220.

If a full memory erase is to be performed (act 610), both bits (e.g., bits 440 and 450) of memory cell 410 may be erased using second source, drain, and gate biases (act 630). In this situation, the second source, drain, and gate biases are selected so as to provide enough punch-through current to memory cell 410 while the drain voltage is greater than about 4 volts and the source voltage is approximately zero. For example, in one implementation, erasing of both bits of memory cell 410 may be performed by applying a gate to substrate bias of about −4 volts to about −8 volts, a source to substrate bias of about −1 volts to about 2 volts, and a drain to substrate voltage of about 5 volts to about 6 volts. During erasing, electrons may tunnel from both storage regions 440 and 450 into substrate 210 (e.g., source or drain regions 420/430) via dielectric layer 220. With a high drain to source voltage (Vds), the hole distribution in the channel region of memory cell 410 is wider and the threshold voltage (Vt) of the channel can be lowered (e.g., to less than 2 volts) within a fixed amount of time (e.g., approximately 1 millisecond), thereby allowing for both bits 440 and 450 of memory cell 410 to be erased. With a lower Vds, the Vt can be lowered locally so as to erase a single bit of memory cell 410.

Thus, in implementations consistent with the principles of the invention, all bits of a memory cell can be erased in a single erase operation, thereby reducing the time in which a memory cell can be erased.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the invention. However, implementations consistent with the invention can be practiced without resorting to the details specifically set forth herein. In other instances, well known processing structures have not been described in detail, in order not to unnecessarily obscure the thrust of the present invention. In practicing the invention, conventional deposition, photo-lithographic and etching techniques may be employed, and hence, the details of such techniques have not been set forth herein in detail.

While series of acts have been described with regard to FIGS. 1 and 6, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method for erasing a memory cell of a semiconductor device that includes a plurality of memory cells, each memory cell of the plurality of memory cells including a plurality of storage regions, the method comprising:
   determining that each storage region of the plurality of storage regions of a first memory cell is to be erased; and
   erasing the plurality of storage regions of the first memory cell via a single hot hole injection process, the erasing including:
      applying a gate to substrate bias of about −4 volts to about −8 volts,
      applying a source to substrate bias of about −1 volts to about 2 volts, and
      applying a drain to substrate bias of about 5 volts to about 6 volts.

2. The method of claim 1 wherein the plurality of storage regions of the first memory cell includes two storage regions.

3. The method of claim 1 wherein the single hot hole injection process lowers a threshold voltage of the first memory cell to less than a predetermined value.

4. The method of claim 3 wherein the predetermined value is about 2 volts.

5. The method of claim 3 wherein the threshold voltage is lowered to less than the predetermined value within approximately 1 millisecond.

6. The method of claim 1 wherein the single hot hole injection process includes a band-to-band (BTB) hot hole injection process.

7. The method of claim 1 further comprising:
   determining that a single storage region of the plurality of storage regions of a second memory cell is to be erased; and
   erasing the single storage region of the second memory cell via a second single hot hole injection.

8. The method of claim 7 wherein the erasing the single storage region includes:
   applying a gate to substrate bias of about −4 volts to about −8 volts,
   applying a source to substrate bias of about −1 volts to about 2 volts, and
   applying a drain to substrate bias of about 4 volts to about 5 volts.

9. The method of claim 7 wherein the second single hot hole injection lowers a threshold voltage of the single storage region in the second memory cell to less than a second predetermined value, a threshold voltage of at least one other storage region in the second memory cell not being lowered to less than the second predetermined voltage.

10. A method for erasing a memory cell of a semiconductor device, the memory cell including a gate region, a source region, and a drain region and including a plurality of storage regions, the method comprising:
  applying a gate to substrate bias to the memory cell;
  applying a source to substrate bias to the memory cell, the source to substrate bias ranging from approximately −1 volts to approximately 2 volts; and
  applying a drain to substrate bias to the memory cell, the gate to substrate bias, the source to substrate bias, and the drain to substrate bias causing all of the plurality of storage regions of the memory cell to be erased.

11. The method of claim 10 wherein the gate to substrate bias ranges from approximately −4 volts to approximately −8 volts.

12. The method of claim 11 wherein the drain to substrate bias ranges from approximately 5 volts to approximately 6 volts.

13. The method of claim 10 wherein the applying the gate to substrate bias, the source to substrate bias, and the drain to substrate bias causes a threshold voltage of the plurality of storage regions of the memory cell to be lowered to less than a predetermined voltage.

14. The method of claim 13 wherein the predetermined voltage is 2 volts.

15. The method of claim 10 wherein the memory cell further includes a channel, a length of the channel ranging from about 100 Å to about 10,000 Å.

16. A memory cell comprising:
  a substrate;
  a first dielectric layer formed over the substrate;
  a charge storage element configured to store two bits of data, the two bits of data being erased together by applying a gate to substrate bias of about −4 volts to about −8 volts, applying a source to substrate bias of about −1 volts to about 2 volts, and applying a drain to substrate bias of about 5 volts to about 6 volts;
  an intergate dielectric formed over the charge storage element;
  a control gate formed over the intergate dielectric;
  a source region; and
  a drain region, a distance from the source region to the drain region ranging from about 100 Å to about 10,000 Å.

17. The memory cell of claim 16 wherein the two bits of data are erased together via a single band-to-band induced hot hole injection.

* * * * *